(12) United States Patent
Ko

(10) Patent No.: US 9,644,256 B2
(45) Date of Patent: May 9, 2017

(54) MASK ASSEMBLY AND THIN FILM DEPOSITION METHOD USING THE SAME

(71) Applicant: SAMSUNG DISPLAY CO., LTD., Gyeonggi-do (KR)

(72) Inventor: Jung Woo Ko, Gyeonggi-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 331 days.

(21) Appl. No.: 14/029,833

(22) Filed: Sep. 18, 2013

(65) Prior Publication Data

US 2014/0335688 A1   Nov. 13, 2014

(30) Foreign Application Priority Data

May 13, 2013  (KR) ................. 10-2013-0053852

(51) Int. Cl.
*H01L 51/50* (2006.01)
*H01L 51/56* (2006.01)
*C23C 14/04* (2006.01)

(52) U.S. Cl.
CPC ............ *C23C 14/042* (2013.01); *H01L 51/56* (2013.01)

(58) Field of Classification Search
CPC .................. H01L 51/0011; C23C 14/042
See application file for complete search history.

(56) References Cited

U.S. PATENT DOCUMENTS

2010/0267227 A1 * 10/2010 Ko .................. C23C 14/042
                                                   438/597

FOREIGN PATENT DOCUMENTS

| KR | 1020070109613 | 11/2007 |
| KR | 1020110088612 | 8/2011 |
| KR | 1020120069396 | 6/2012 |

* cited by examiner

*Primary Examiner* — Xiao Zhao
(74) *Attorney, Agent, or Firm* — F. Chau & Associates, LLC

(57) ABSTRACT

A mask assembly and a thin film deposition method using the same are provided.

The mask assembly includes a mask frame including first to fourth sides. The first to fourth sides form a rectangle. Inner sides of the rectangle define a window. The mask frame has a plurality of substrate seating portions provided to project toward the window from at least two corners. The two corners face each other in a diagonal direction. The mask assembly includes four corners positioned where the first to fourth sides of the mask assembly meet each other. A mask includes a plurality of openings for deposition. The plurality of openings are arranged to correspond to the window.

20 Claims, 15 Drawing Sheets

MASK ASSEMBLY AND THIN FILM DEPOSITION METHOD USING THE SAME

CROSS-REFERENCE TO RELATED APPLICATIONS

This application claims priority under 35 U.S.C. §119 to Korean Patent Application No. 10-2013-0053852, filed on May 13, 2013, the disclosure of which is incorporated by reference herein in its entirety.

TECHNICAL FIELD

The present invention relates to a mask assembly, and more particularly to a thin film deposition method using the same.

DISCUSSION OF RELATED ART

Among display devices, an organic light emitting display device may be a self-luminous display device. Organic light emitting display devices may have a wide viewing angle, superior contrast, and high response speed.

The organic light emitting display device may include an intermediate layer that includes at least a light emitting layer between electrodes facing each other. The electrodes and the intermediate layer may be formed in various methods, and one of such methods is a deposition method.

In one method of fabricating an organic light emitting display device using a deposition method, a thin film having a desired pattern may be formed on a substrate by making a mask having the same opening pattern as a thin film pattern to be formed on the substrate. For example, a fine metal mask (FMM) may come in close contact with the substrate and a deposition material may be deposited on the substrate through the FMM.

SUMMARY

In the case of arranging a substrate on a mask assembly, an inner side of the mask frame and an outer side of the substrate overlap each other with a predetermined width. A thin film is formed on the substrate through deposition of a deposition material thereon. An inner side of the mask frame defines a window to support the substrate. A wide overlapping area occurs, and there is a limit in increasing the number of unit cells which are intended to be actually formed on the substrate.

Exemplary embodiments of the present inventive concept provide a mask assembly, which can increase the number of unit cells that are formed on a substrate while minimizing an overlapping area between a mask frame and the substrate.

In at least one exemplary embodiment of the present inventive concept a thin film deposition method using a mask assembly is provided, which can increase the number of unit cells that are formed on a substrate while minimizing an overlapping area between the mask frame and the substrate.

In at least one exemplary embodiment of the present inventive concept, there is provided a mask assembly including a mask frame including first to fourth sides. The first to fourth sides form a rectangle. The inner sides of the rectangle define a window. The mask frame has a plurality of substrate seating portions. The substrate seating portions may project toward the window from at least two corners. The two corners face each other in a diagonal direction. The mask assembly includes a mask including a plurality of openings. The mask is fixed to the mask frame. The plurality of openings are arranged to correspond to the window.

In exemplary embodiments of the present inventive concept, there is provided a thin film deposition method including preparing a mask frame including first to fourth sides. The first to fourth sides form a rectangle. The inner sides of the rectangle define a window. The mask frame has a plurality of substrate seating portions provided to project toward the window from at least two corners. The two corners face each other in a diagonal direction. The method includes arranging a mask including a plurality of openings on the mask frame, and fixing the mask to the mask frame. The plurality of openings are arranged to correspond to the window. The method includes seating a substrate on the mask so that outer sides of the substrate are arranged to coincide with inner sides of the first to fourth sides of the mask frame. The method includes depositing a deposition material on the substrate through the window and the plurality of openings for deposition.

Exemplary embodiments of the present inventive concept include the plurality of substrate seating portions provided to project toward the window from at least two corners. The two corners face each other in the diagonal direction. The overlapping area between the substrate and the mask frame can be minimized and the substrate can be stably supported. A thin film can be formed on the substrate through deposition of the deposition material.

The mask assembly according to exemplary embodiments of the present inventive concept can increase the number of unit cells to be formed on the substrate.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Exemplary embodiments of the present inventive concept and methods of accomplishing the same may be understood more readily by reference to the following detailed description of preferred embodiments and the accompanying drawings. Exemplary embodiments of the present inventive concept may, however, be embodied in many different forms and should not be construed as being limited to the embodiments set forth herein. Rather, these embodiments are provided so that this disclosure will be thorough and complete and will fully convey the concept of the present inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

The terms first, second, third etc. may be used herein to describe various elements, components, regions, layers and/or sections, however, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Exemplary embodiments of the present inventive concept will be described in detail with reference to the accompanying drawings.

Figure 1:
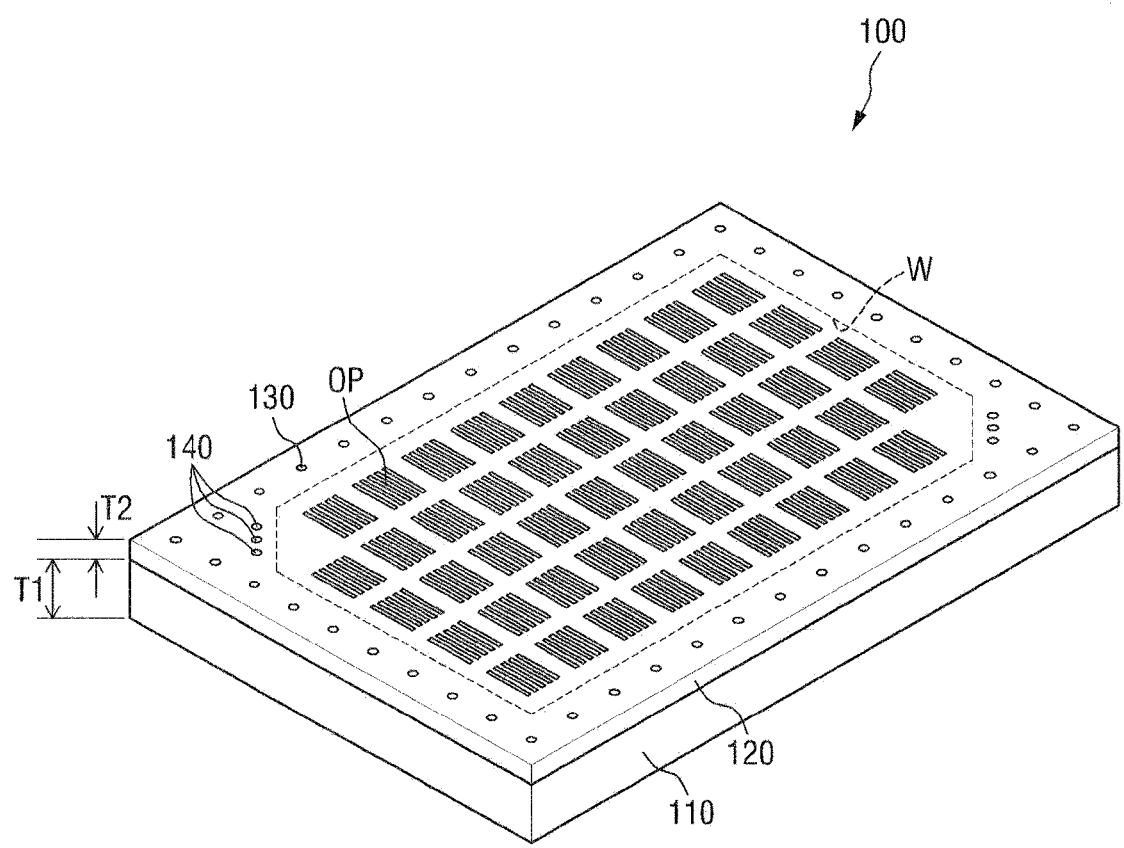
FIG. 1 is a perspective view of a mask assembly according to an exemplary embodiment of the present inventive concept.
Figure 2:
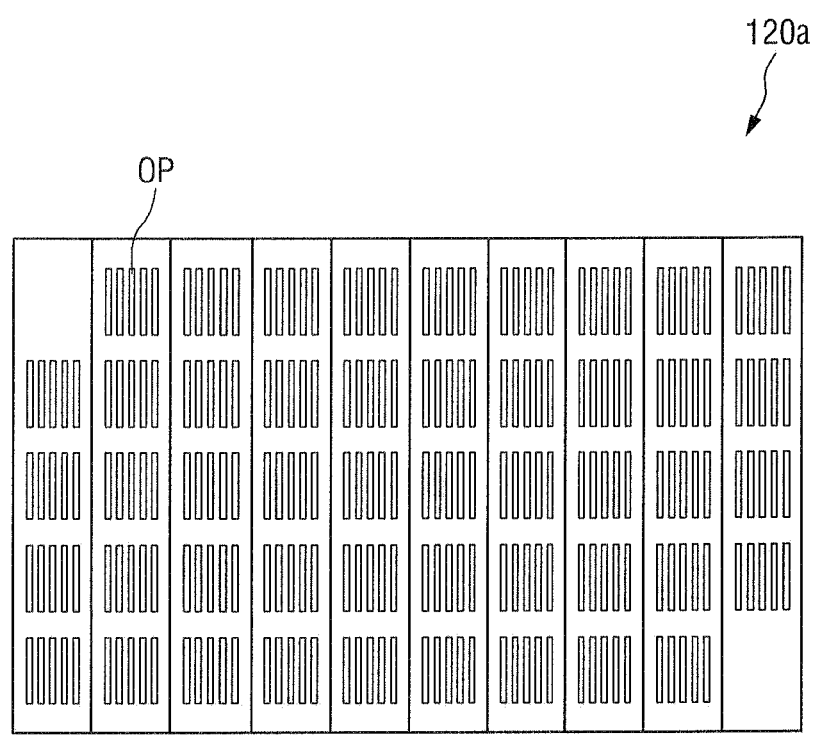
FIG. 2 is a plan view illustrating a mask in accordance with the exemplary embodiment of the present inventive concept illustrated in FIG. 1.

FIG. 1 is a perspective view of a mask assembly according to an exemplary embodiment of the present inventive concept, and FIG. 2 is a plan view illustrating an exemplary embodiment of a mask illustrated in FIG. 1.

Referring to FIG. 1, a mask assembly 100 may include a mask frame 110, a mask 120, and welding portions 130.

The mask assembly 100 may be used to form a thin film pattern through deposition of a deposition material on a desired position of a substrate. The substrate may be a substrate for a display device. For example, the substrate may be a substrate for a display device, such as an organic light emitting display device, a liquid crystal display device, and a plasma display device. The substrate may be a bare substrate or a substrate where structures, such as thin films and wires, are partially formed. The substrate may be a motherboard including a plurality of unit cells which may be gathered as display substrates through cutting in the unit of a cell.

The mask frame 110 may support the mask 120, and may be formed of a metal material having high rigidity, for example, metal, such as stainless steel. The mask frame 110 may be coupled to the mask 120 by welding. The mask frame 110 may be formed as a structure that does not disturb the deposition when a deposition material is deposited on the substrate through the mask 120. For example, the mask frame 110 may have a band shape in to which a window W is defined.

The mask 120 may include a plurality of openings OP. The openings OP may be for deposition. The mask 120 may be fixed to the mask frame 110. The plurality of openings OP may be used for deposition. The plurality of openings may be arranged to correspond to the window W of the mask frame 110. The mask 120 may be formed so that the plurality of openings OP for deposition do not overlap a plurality of substrate seating portions (e.g. SS in FIG. 3) of the mask frame 110. The mask 120 may be an integrated type mask in which the plurality of openings OP are formed on one metal plate as illustrated, for example, in FIG. 1. The mask 120a may be a separated type mask in which the plurality of openings OP are dividedly formed on a plurality of metal plates as illustrated, for example, in FIG. 2.

The plurality of openings OP may be positioned in a line and may be spaced apart from each other in one direction. The plurality of openings OP may be exposed through the window W of the mask frame 110. Each of the openings OP may include a plurality of fine openings. The plurality of fine openings may be formed as a shape that corresponds to the shape of a thin film to be deposited on the substrate that is arranged on the mask 120. In a deposition process, a deposition material may be deposited on the substrate through the openings OP, and a thin film (e.g., a metal layer of an organic light emitting layer of an organic light emitting display device) having a desired shape may be formed.

One opening OP may correspond to one flat panel display (e.g., organic light emitting display device) that may be a unit cell. Patterns, which correspond to a plurality of flat panel displays, may be simultaneously deposited through a single process using a mask assembly 100. The mask assembly 100 may correspond to a mother substrate, and the patterns, which may correspond to the plurality of flat panel displays, may be simultaneously formed on the mother substrate.

The welding portions 130 may be formed on borders of the mask 120. The borders of the mask 120 may correspond to respective sides of the mask frame 110. The welding portions 130 may be formed by welding that is used to fix the mask 120 on the mask frame 110, for example, spot welding or laser welding.

The mask assembly 100 may include auxiliary welding portions 140. The auxiliary welding portions 140 may be formed on parts of the mask 120 that correspond to the plurality of substrate seating portions (e.g. SS in FIG. 3) of the mask frame 110. The auxiliary welding portions 140 can fix the mask frame 110. The plurality of substrate seating portions (e.g. SS in FIG. 3) may be formed on the mask frame 110.

Figure 3:
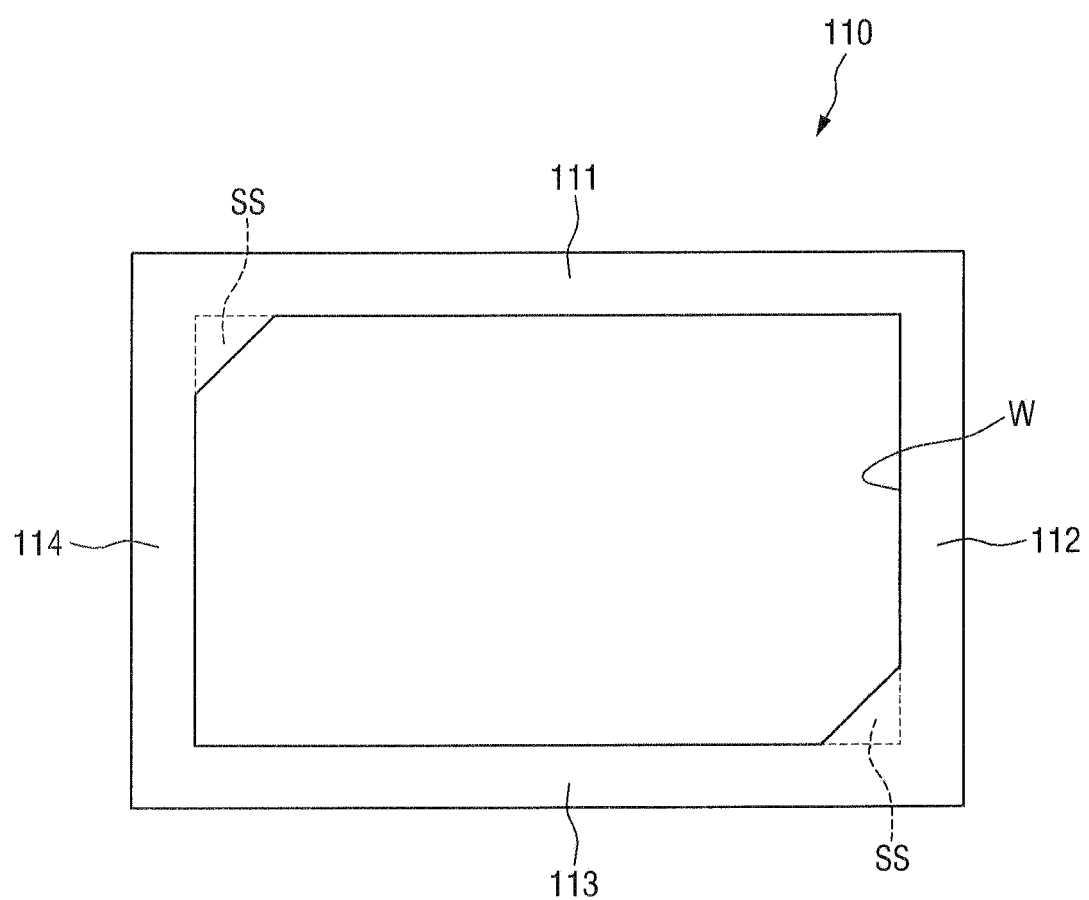
FIG. 3 is a plan view of a mask frame in accordance with the exemplary embodiments of the present inventive concept illustrated in FIG. 1.
Figure 4:
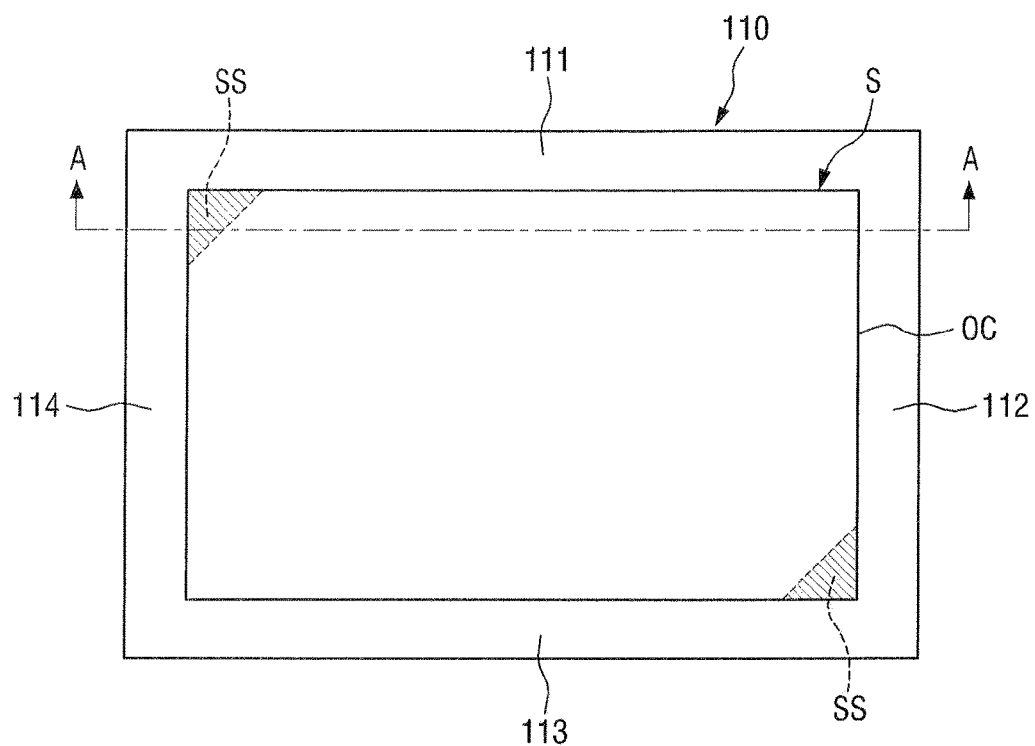
FIG. 4 is a plan view illustrating an arrangement relationship between a substrate and a mask frame in a state where a mask is omitted from the mask assembly of FIG. 1.
Figure 5:
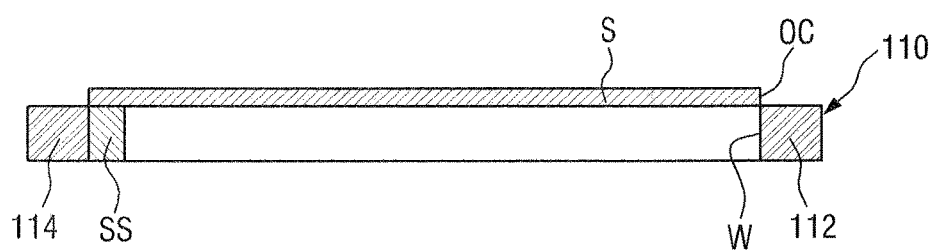
FIG. 5 is a cross-sectional view taken along line A-A in FIG. 4.

FIG. 3 is a plan view of a mask frame in accordance with the exemplary embodiments of the present inventive concept illustrated in FIG. 1. FIG. 4 is a plan view illustrating an arrangement relationship between a substrate and a mask frame in a state where a mask is omitted from the mask assembly of FIG. 1, and FIG. 5 is a cross-sectional view taken along line A-A in FIG. 4.

Referring to FIG. 3, the mask frame 110 may include first to fourth sides 111 to 114, which may form a rectangle. The window W may be defined by the inner sides of the first to fourth sides 111 to 114.

The mask frame 110 may include a plurality of substrate seating portions SS that may project toward the window W from at least two corners. The at least two corners may face each other in a diagonal direction For example, a substrate seating portion SS may be formed where the first side 111 and the fourth side 114 meet each other. For example, the substrate seating portions SS may be formed to project toward the window W from the corner at which the first side 111 and the fourth side 114 meet each other and the corner at which the second side 112 and the third side 113 meet each other. In at least one exemplary embodiment of the present inventive concept, the substrate seating portions SS may be formed to project toward the window W from the corner at which the first side 111 and the second side 112 meet each other and the corner at which the third side 113 and the fourth side 114 meet each other. The substrate seating portions SS may have a triangular shape.

The plurality of substrate seating portions SS may stably support the substrate S while minimizing an overlapping area between the substrate S and the mask frame 110. A thin film may be formed on the substrate through deposition of the deposition material thereon. Outer sides OC of the substrate S may coincide with inner sides of the first to fourth sides 111 to 114 of the mask frame 110. The overlapping area between the substrate S and the mask frame 110 may be reduced to a shaded area as shown, for example, in FIG. 4. The number of unit cells to be formed on the substrate S can be increased.

The substrate S may be supported by the mask 120 that may be coupled to the mask frame 110. The mask 120 may have a thin thickness that is insufficient for the mask 120 to support the substrate S. The thickness T1 of the mask frame 110 may be thicker than the thickness T2 of the mask 120. The thickness T1 may increase a supporting force for the plurality of substrate seating portions SS. The substrate seating portions SS may be associated with the mask frame 110 and may support the substrate S.

FIGS. 6 to 10 are plan views illustrating various exemplary embodiments of the mask frame in FIG. 1.

Figure 6:
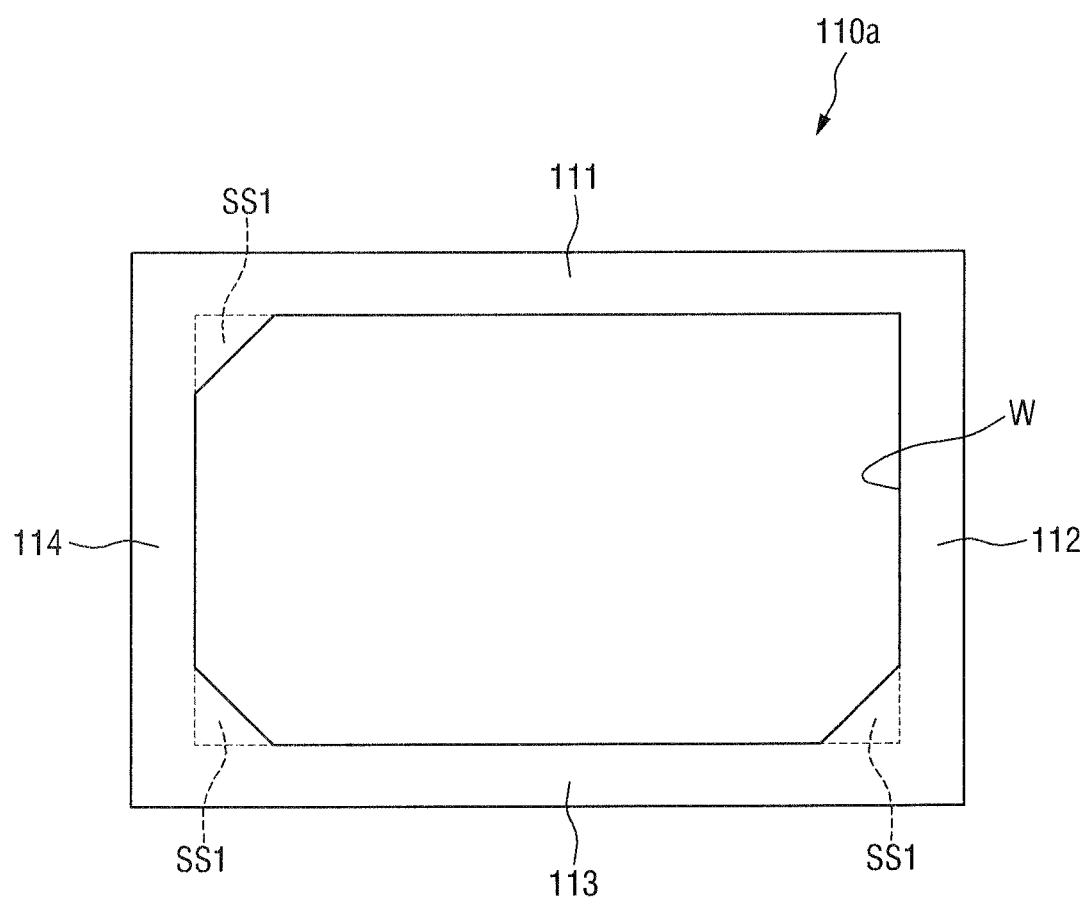
FIGS. 6 to 10 are plan views illustrating various exemplary embodiments of the mask frame in FIG. 1.
Figure 7:
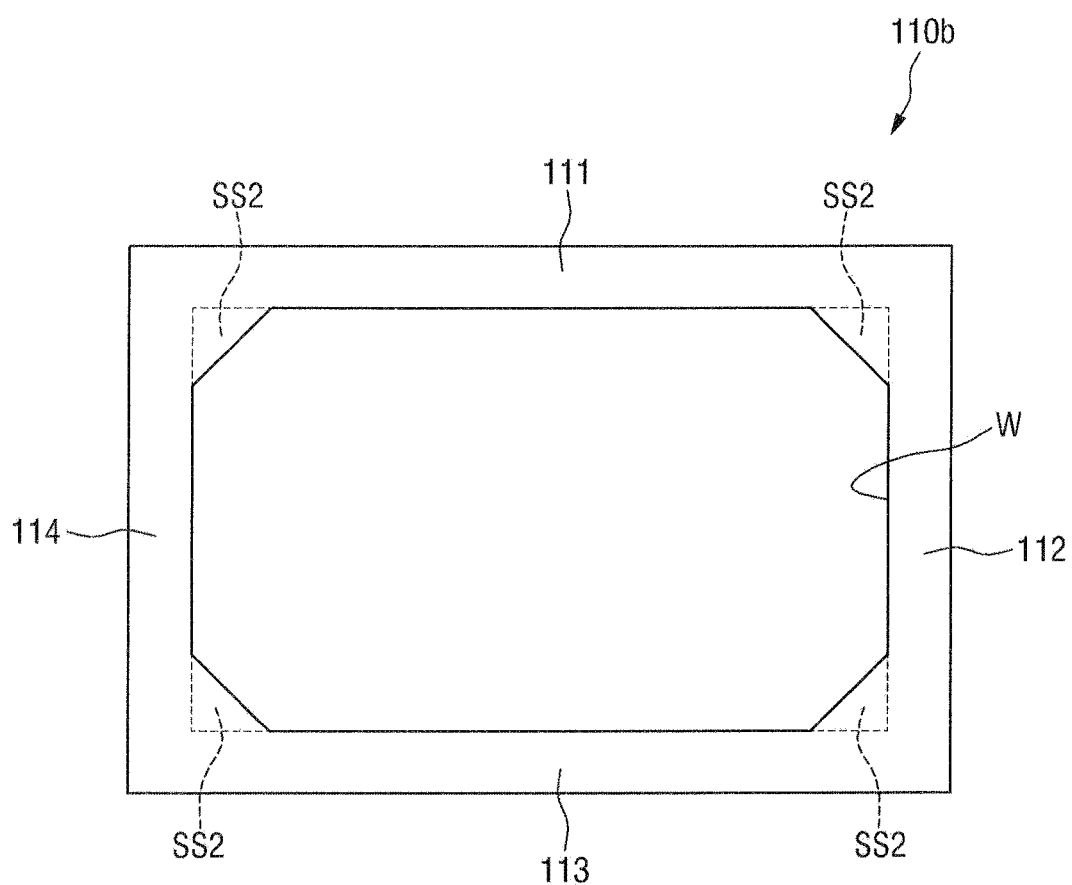

FIG. 6 illustrates, for example, that a mask frame 110a may include three substrate seating portions SS1. The mask frame 110a may include the substrate seating portions SS1, which may project toward the window W from two corners. Two of the three substrate seating portions SS1 may face each other in a diagonal direction. The substrate seating portions SS1 may include a third substrate seating portion SS1 which may not face another substrate seating portion SS1 in a diagonal direction. For example, the substrate seating portions SS1 may be formed to project toward the window W from the corner at which the first side 111 and the fourth side 114 meet each other, the corner at which the second side 112 and the third side 113 meet each other, and the corner at which the third side 113 and the fourth side 114 meet each other, respectively. The substrate seating portions SS1 may have a triangular shape. The substrate seating portions SS1 may increase the number of areas that can support the substrate. The substrate may be seated on the mask assembly. FIG. 7 illustrates a mask frame 110b which may include four substrate seating portions SS2. The mask frame 110b may include the substrate seating portions SS2, which project toward the window W from the four corners, at which the first to fourth sides 111 to 114 meet each other, respectively. The substrate seating portions SS2 may be formed to project toward the window W from the corner at which the first side 111 and the fourth side 114 meet each other, the corner at which the second side 112 and the third side 113 meet each other, the corner at which the third side 113 and the fourth side 114 meet each other, and the corner at which the fourth side 114 and the first side 111 meet each other, respectively. The substrate seating portions SS2 may have a triangular shape. The substrate seating portions SS2 may increase the number of areas that can support the substrate. The substrate may be seated on the mask assembly.

Figure 8:
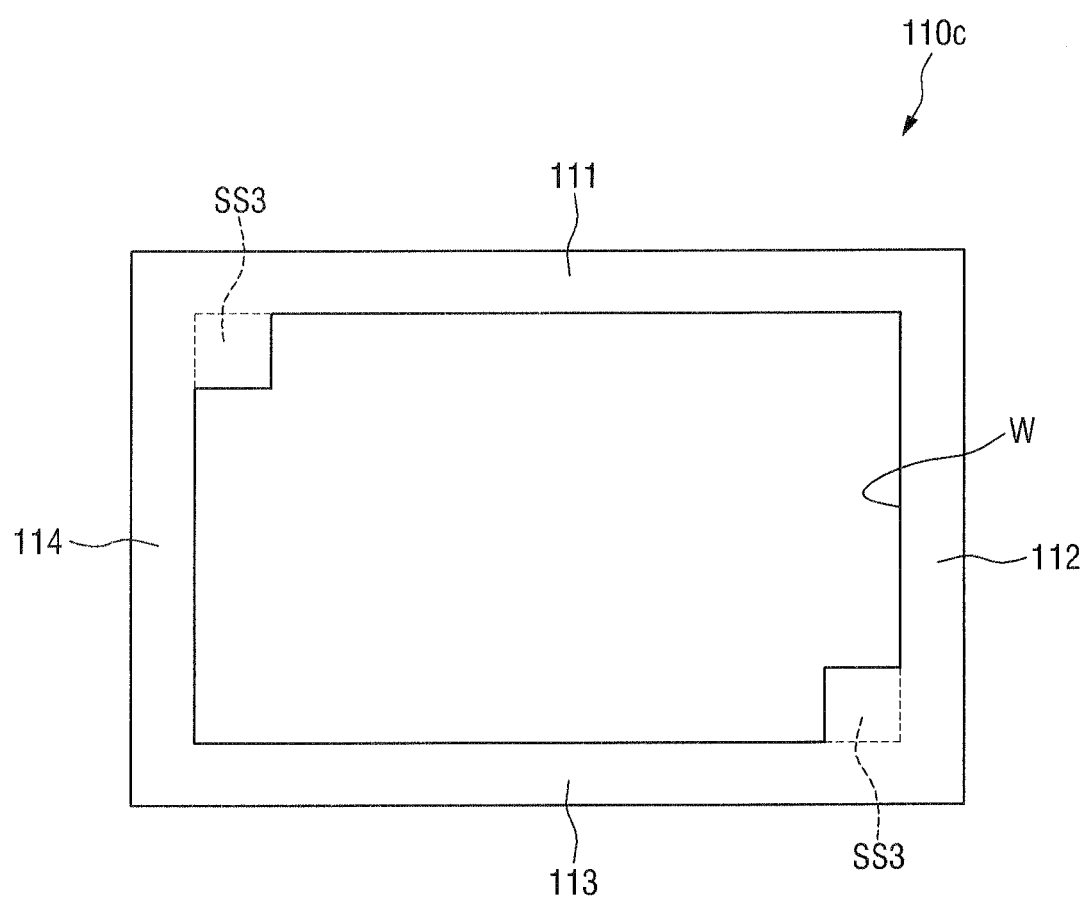

FIG. 8 illustrates a mask frame 110c which may include rectangular substrate seating portions SS3. The rectangular substrate seating portions SS3 may increase a contact area with the substrate. The substrate may be seated on the mask assembly. FIG. 8 illustrates two substrate seating portions SS3 which may project toward the window W from the corner at which the first side 111 and the fourth side 114 meet each other and the corner at which the second side 112 and the third side 113 meet each other. The number of substrate seating portions SS3 may be three as shown, for example, in FIG. 6, or may be four as shown, for example, in FIG. 7.

Figure 9:
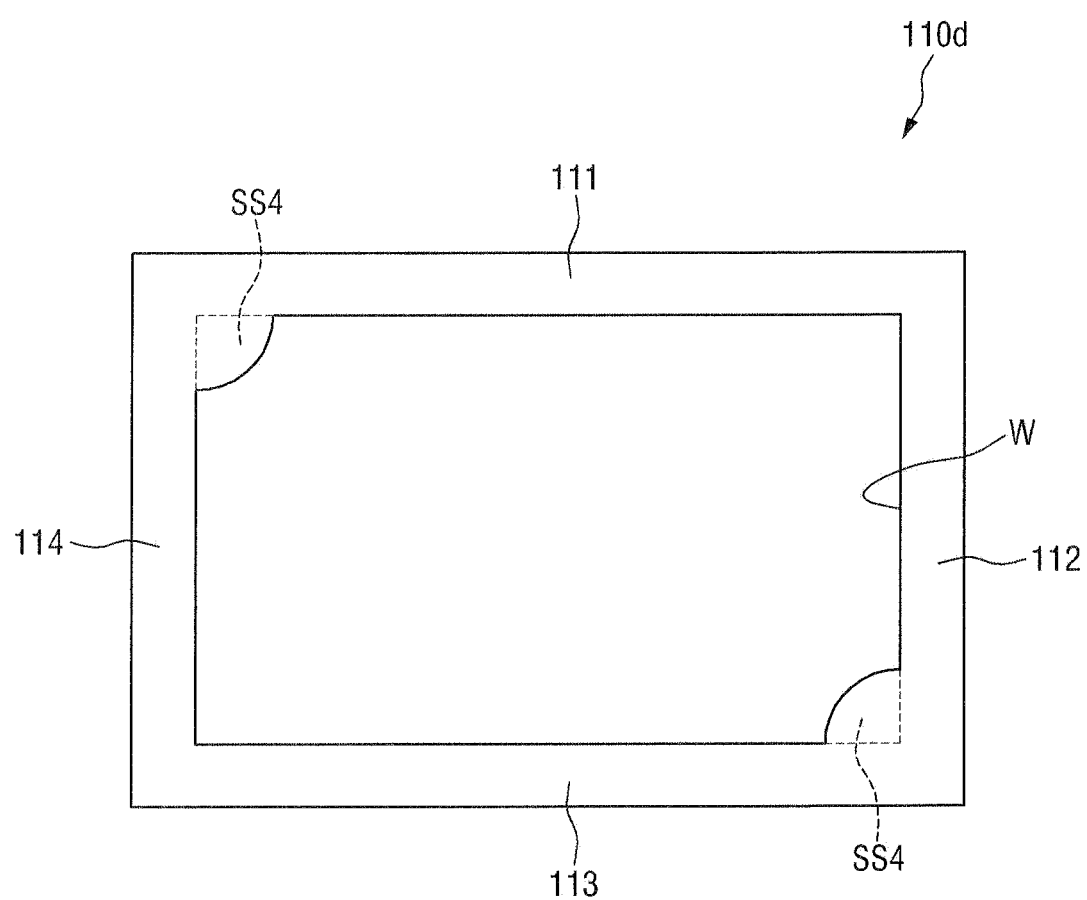

FIG. 9 illustrates a mask frame 110d which may include fan-shaped substrate seating portions SS4. The fan-shaped substrate seating portions SS4 may increase the contact area with the substrate. The substrate may be seated on the mask assembly. FIG. 9 illustrates two substrate seating portions SS4. The substrate seating portions SS4 may project toward the window W from the corner at which the first side 111 and the fourth side 114 meet each other and the corner at which the second side 112 and the third side 113 meet each other. The number of substrate seating portions SS4 may also be three as shown in FIG. 6, or may be four as shown in FIG. 7.

Figure 10:
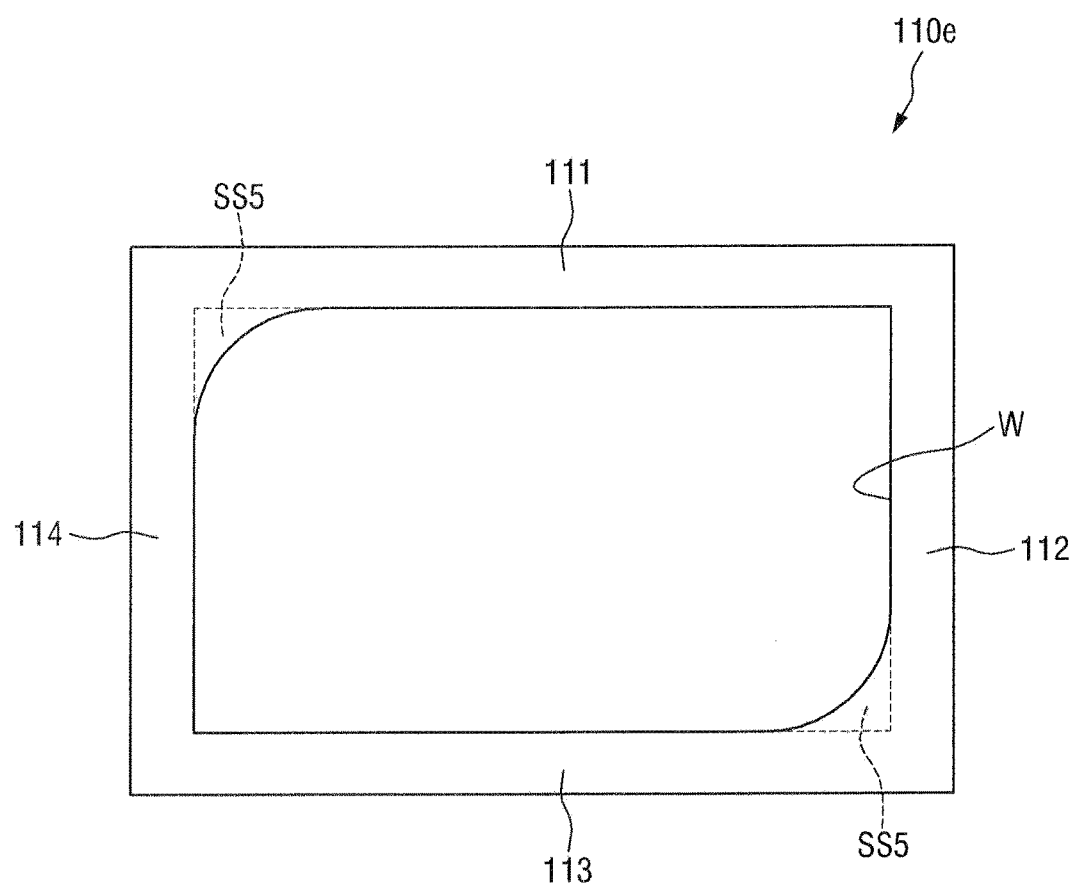

FIG. 10 illustrates a mask frame 110e which may include substrate seating portions SS5. The substrate seating portions SS5 may have a shape obtained by removing a fan shape from the rectangle. The shape obtained by removing the fan shape from the rectangle may increase the contact area with the substrate. The substrate may be seated on the mask assembly. FIG. 10 illustrates two substrate seating portions SS5 which may project toward the window W. The substrate seating portions SS5 may project toward the window from the corner at which the first side 111 and the fourth side 114 meet each other and the corner at which the second side 112 and the third side 113 meet each other. The number of substrate seating portions SS5 may also be three as shown in FIG. 6, or may be four as shown in FIG. 7.

The mask assembly 100 according to exemplary embodiments of the present inventive concept may include the plurality of substrate seating portions SS. The substrate seating portions SS may project toward the window W from at least two corners. The two corners may face each other in the diagonal direction. The substrate S can be stably supported and the overlapping area between the substrate S and the mask frame 110 can be minimized. A thin film may be formed on the substrate through the deposition of the deposition material thereon.

The number of unit cells to be formed on the substrate S can be increased by the mask assembly 100 according to exemplary embodiments of the present inventive concept.

Figure 11:
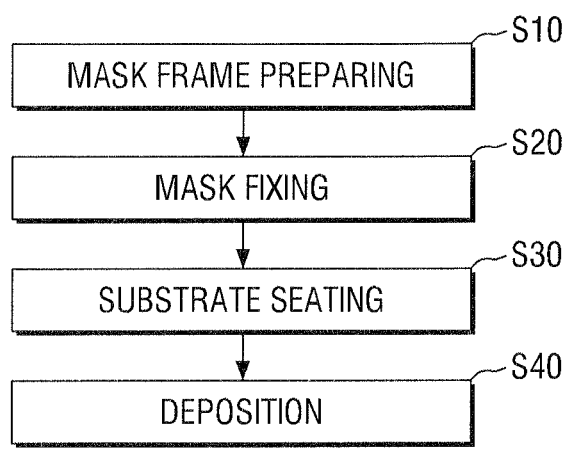
FIG. 11 is a flowchart illustrating a thin film deposition method using the mask assembly of FIG. 1.

FIG. 11 is a flowchart illustrating, for example, a thin film deposition method using the mask assembly of FIG. 1. FIGS. 12 to 16 are views illustrating the thin film deposition method using, for example, the mask frame of FIG. 11.

Referring to FIG. 11, a thin film deposition method using the mask assembly 100 according to exemplary embodiments of the present inventive concept may include mask frame preparing (S10), mask fixing (S20), substrate seating (S30), and deposition (S40).

Figure 12:
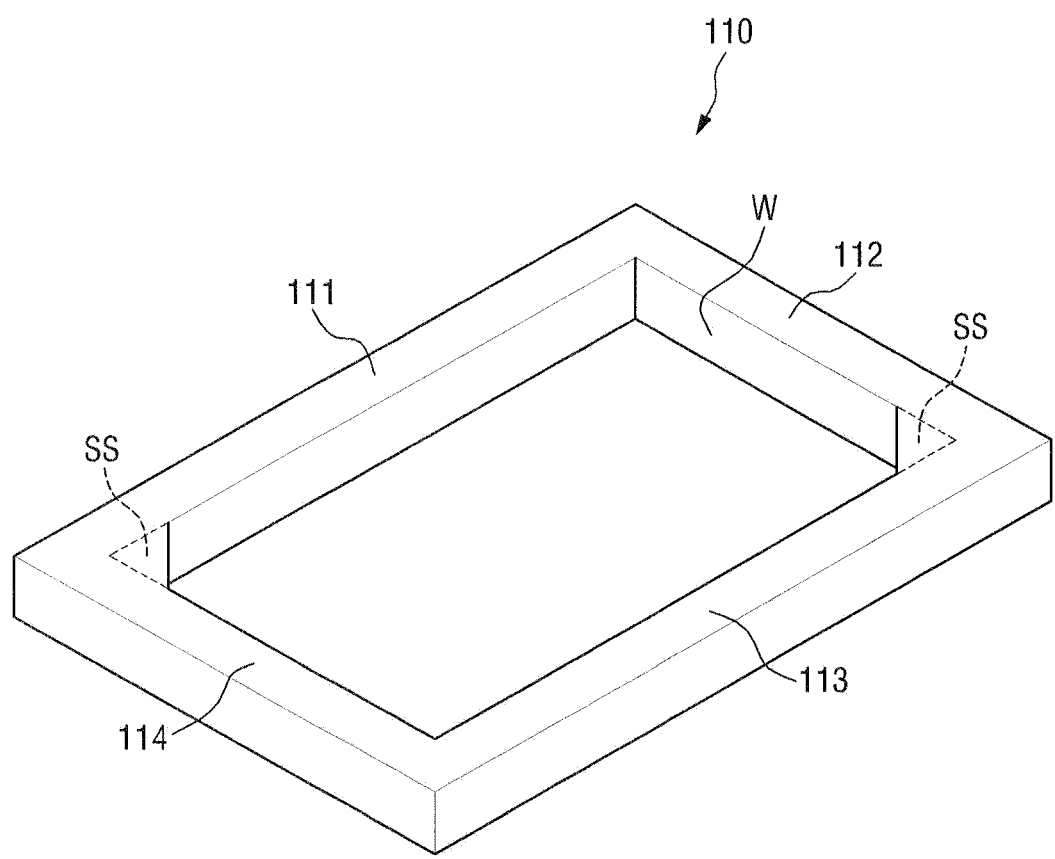
FIGS. 12 to 16 are views explaining the thin film deposition method using the mask frame of FIG. 11.

Referring to FIG. 12, a mask frame 110 may be prepared including first to fourth sides 111 to 114, which may form a rectangle. Preparing the mask frame 110 may be performed according to step (S10) (e.g. FIG. 11). Inner sides of the rectangle may define a window W. The mask frame 110 may include a plurality of substrate seating portions SS. The substrate seating portions SS may project toward the window W. The substrate seating portions SS may project toward the window W from at least two corners, which may face each other in a diagonal direction. The corners of the mask frame may be where the first to fourth sides 111 to 114 meet each other, respectively.

Figure 13:
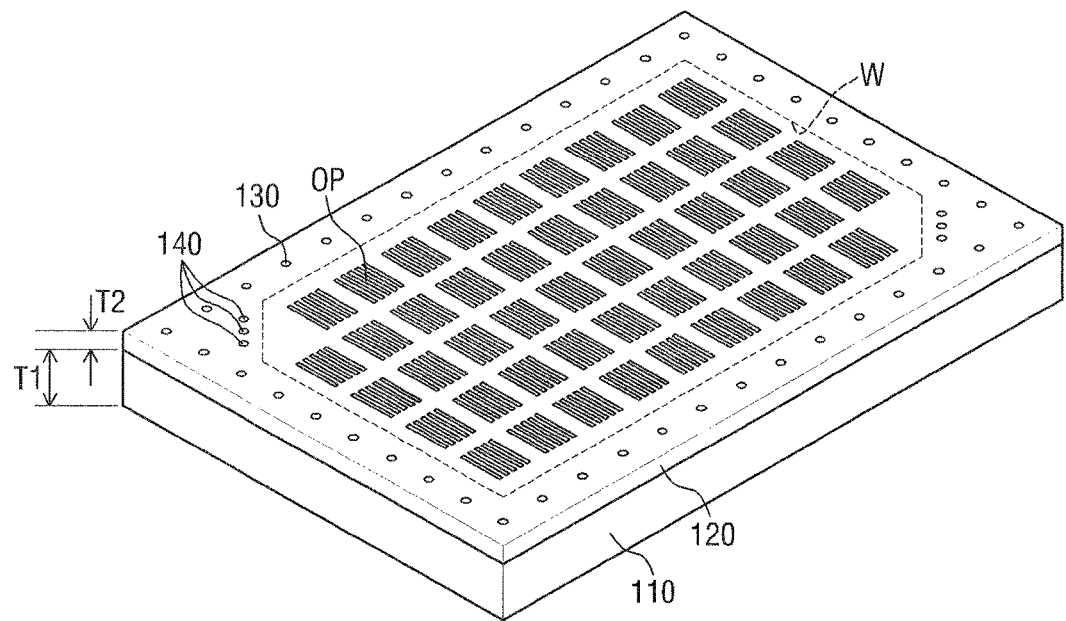

The mask frame preparing (S10) may include forming the mask frame 110 so that the mask frame 110 has a thickness T1 that is thicker than a thickness T2 of the mask 120 (e.g. FIG. 13). The mask frame preparing (S10) may include forming the substrate seating portions SS so that a planar shape of the substrate seating portion becomes any one of a triangle, a rectangle, a fan shape, and a shape obtained by removing the fan shape from the rectangle.

Referring to FIG. 13, the mask fixing (S20) may arrange a mask 120 including a plurality of openings OP. The openings OP may be arranged to correspond to the window W. The mask fixing (S20) may fix the mask 120 to the mask frame 110.

The mask 120 may be prepared as an integrated type mask in which the plurality of openings OP may be formed on one metal plate or a separated type mask in which the plurality of openings OP are dividedly formed on a plurality of metal plates. The mask 120 may be formed so that the plurality of openings OP do not overlap the substrate seating portion SS.

In the mask fixing (S20), the mask fixing may be performed by forming welding portions 130 on borders of the mask 120. The borders of the mask 120 may correspond to the respective sides 111 to 114 of the mask frame 110. The mask fixing (S20) may include forming auxiliary welding portions 140 on parts of the mask 120. The parts of the mask 120 may correspond to the plurality of substrate seating portions SS of the mask frame 110.

As the mask frame preparing (S10) and the mask fixing (S20) are performed, the mask assembly 100 may be completed. The mask assembly 100 may be used in thin film deposition.

Figure 14:
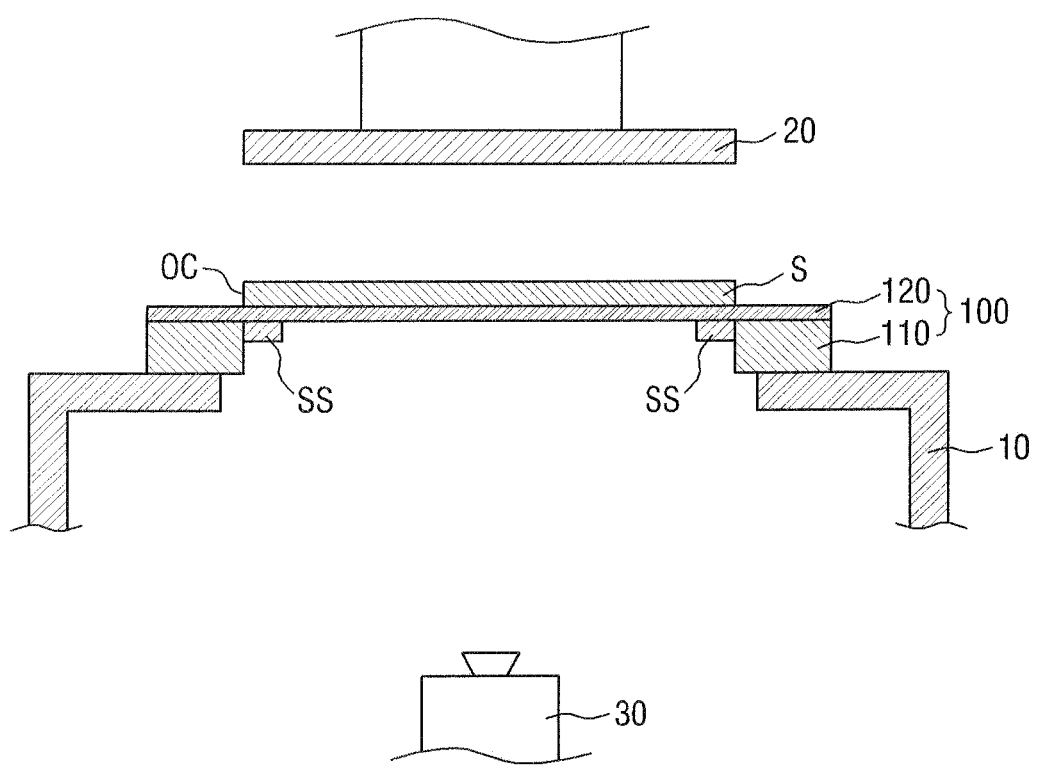
Figure 15:
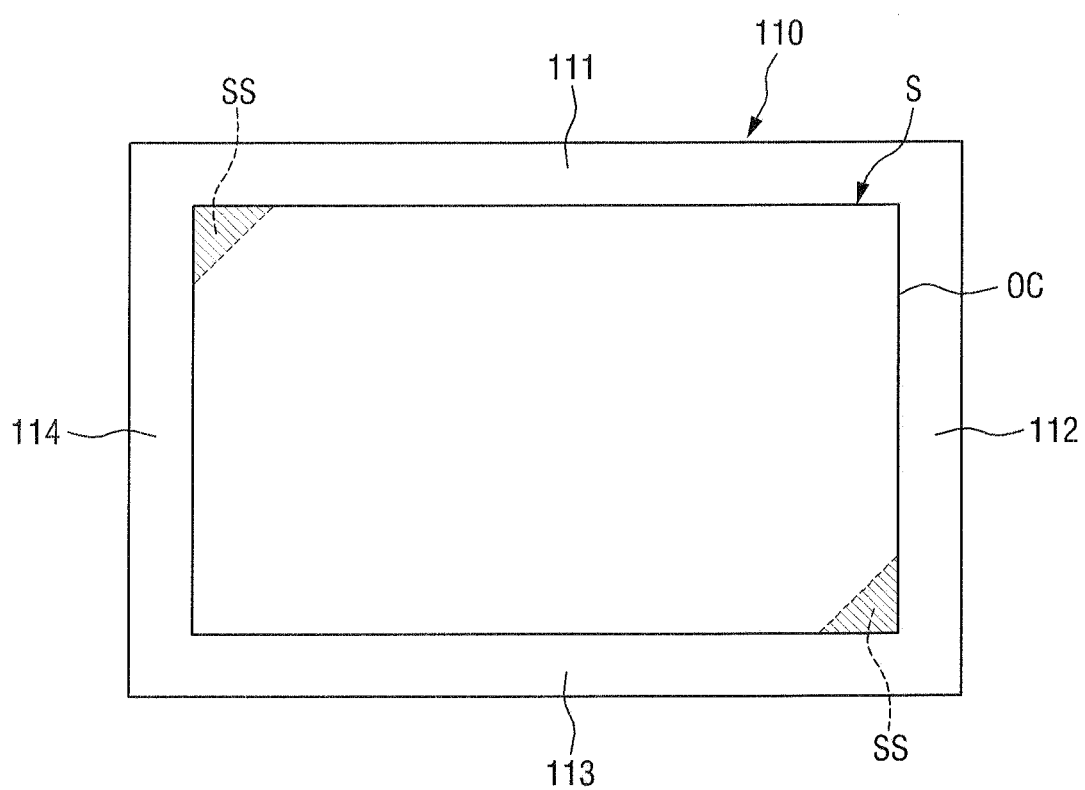

Referring to FIGS. 14 and 15, the substrate seating (S30) may seat the substrate S on the mask 120. Outer sides OC of the substrate S may be arranged to coincide with inner sides of the first to fourth sides 111 to 114 of the mask frame 110.

In the substrate seating (S30), the mask assembly 110 may be first fixed to a frame support 10 in a space in which the deposition process is performed. Then, the substrate S may be arranged on the mask 120 through a transport portion 20. The transport portion 20 may align the outer sides OC of the substrate S to coincide with the inner sides of the first to fourth sides 111 to 114 of the mask frame 110. The substrate seating portions SS can support the substrate S. The substrate seating portions SS can minimize the overlapping area between the substrate S and the mask frame 110 (e.g. SS of FIG. 15). The transport portion 20 may serve to press the substrate S and prevent the substrate S from drooping. The substrate S may be a substrate for a display device, such as an organic light emitting display device, a liquid crystal display device, or a plasma display device.

Figure 16:
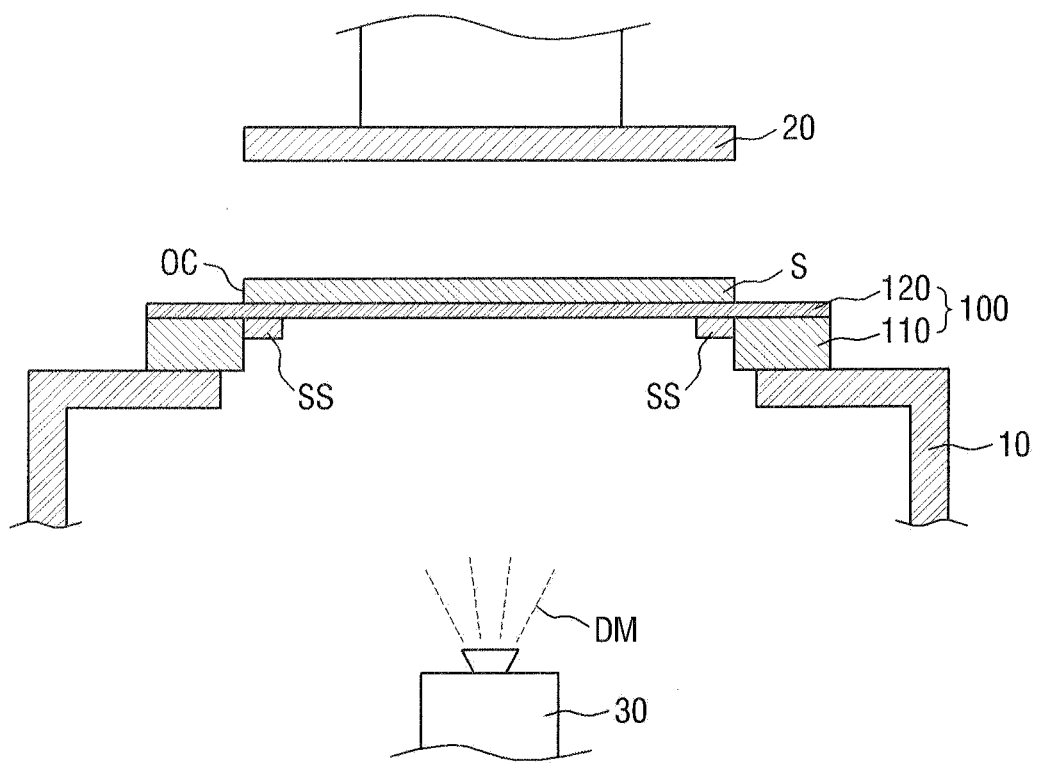

Referring to FIG. 16, the deposition (S40) may deposit a deposition material DM on the substrate S through the window W and the plurality of openings (13 in FIG. 13).

Specifically, in the deposition (S40), the deposition material DM (e.g., metal material or organism) may be supplied to the side of the substrate S so that a desired thin film pattern (e.g., metal layer or organic light emitting layer) is formed on the substrate S using a deposition supply source 30 arranged on a lower portion of the mask assembly 100.

Those skilled in the art will appreciate that many variations and modifications can be made to the preferred embodiments without substantially departing from the principles of the present inventive concept. The foregoing is illustrative of exemplary embodiments of the present inventive concept and is not to be construed as limiting thereof.

What is claimed is:

1. A mask assembly, comprising:
    a mask frame including first to fourth sides, the first to fourth sides forming a rectangle;
    inner sides of the rectangle defining a window;
    a plurality of substrate seating portions disposed on the inner sides of the rectangle defining the window, wherein substrate seating portions of the plurality of substrate seating portions are disposed in at least two corners of the window, the two corners facing each other in a diagonal direction; and
    a mask fixed to the mask frame, the mask comprising a plurality of openings arranged to correspond to the window.

2. The mask assembly of claim 1, wherein a shape of the plurality of substrate seating portions is selected from the group consisting of a triangle, a rectangle, a fan shape, and a shape obtained by removing the fan shape from the rectangle.

3. The mask assembly of claim 1, wherein a thickness of the mask frame is thicker than a thickness of the mask.

4. The mask assembly of claim 1, wherein the mask is an integrated type mask wherein the plurality of openings are formed on a metal plate or a separated type mask wherein the plurality of openings are separately formed on a plurality of metal plates.

5. The mask assembly of claim 1, wherein the plurality of openings are formed on the mask so that the plurality of openings do not overlap the substrate seating portions.

6. The mask assembly of claim 1, wherein welding portions are formed on borders of the mask, the borders corresponding to the respective sides of the mask frame.

7. The mask assembly of claim 6, wherein auxiliary welding portions are formed on parts of the mask, the parts of the mask corresponding to the plurality of substrate seating portions of the mask frame.

8. A thin film deposition method, comprising:
    preparing a mask frame including first to fourth sides, the first to fourth sides forming a rectangle, inner sides of the rectangle defining a window, the mask frame having a plurality of substrate seating portions disposed on the inner sides of the rectangle defining the window, wherein substrate seating portions of the plurality of substrate seating portions are disposed in at least two corners of the window, and the two corners facing each other in a diagonal direction;
    arranging a mask including a plurality of openings on the mask frame, the openings arranged to correspond to the window, and fixing the mask to the mask frame;
    seating a substrate on the mask so that outer sides of the substrate are arranged to coincide with inner sides of the first to fourth sides of the mask frame; and
    depositing a deposition material on the substrate through the window and the plurality of openings.

9. The thin film deposition method of claim 8, wherein the mask frame preparing comprises forming the substrate seating portions so that a shape of the substrate seating portion is selected from the group consisting of a triangle, a rectangle, a fan shape, and a shape obtained by removing the fan shape from the rectangle.

10. The thin film deposition method of claim 8, wherein the mask frame preparing comprises forming the mask frame so that the mask frame has a thickness that is thicker than a thickness of the mask.

11. The thin film deposition method of claim 8, wherein the mask fixing comprises preparing the mask as an integrated type mask wherein the plurality of openings are formed on a metal plate or a separated type mask wherein the plurality of openings are dividedly formed on a plurality of metal plates.

12. The thin film deposition method of claim 8, wherein the mask fixing comprises forming the mask so that the plurality of openings do not overlap the substrate seating portions.

13. The thin film deposition method of claim 8, wherein the mask fixing comprises forming welding portions on borders of the mask, the borders of the mask corresponding to the respective sides of the mask frame.

14. The thin film deposition method of claim 13, wherein the mask fixing comprises forming auxiliary welding portions on parts of the mask, the parts of the mask corresponding to the plurality of substrate seating portions of the mask frame.

15. The thin film deposition method of claim 13, wherein the substrate seating comprises preparing the substrate as a substrate for an organic light emitting display device.

16. The thin film deposition method of claim 13, wherein the deposition comprises preparing a deposition material comprising a metal material for forming a metal layer of the organic light emitting display device or an organism for forming an organic light emitting layer.

17. A mask assembly, comprising:
- a mask frame comprising first to fourth sides, the first to fourth sides form a rectangle;
- inner sides of the rectangle form a window;
- a plurality of substrate seating portions fixed to the mask frame, wherein the plurality of substrate seating portions are disposed on the inner sides of the rectangle forming the window, and wherein a substrate seating portion of the plurality of substrate seating portions is disposed in each of four corners of the window;
- a mask comprising a plurality of openings, the plurality of openings arranged to correspond to the window; and
- the mask fixed to the mask frame by a plurality of welding portions.

18. The mask assembly of claim 17, wherein a shape of the plurality of substrate seating portions is selected from the group consisting of a triangle, a rectangle, a fan shape, and a shape obtained by removing the fan shape from the rectangle.

19. The mask assembly of claim 17, wherein a thickness of the mask frame is thicker than a thickness of the mask.

20. The mask assembly of claim 17, wherein the plurality of openings do not overlap the substrate seating portions.

* * * * *